United States Patent [19]
Kadouchi et al.

[11] Patent Number: 6,020,717
[45] Date of Patent: Feb. 1, 2000

[54] MONITORING APPARATUS FOR A SERIES ASSEMBLY OF BATTERY MODULES

[75] Inventors: Eiji Kadouchi, Toyohashi; Yuichi Watanabe, Shinagawa-ku; Megumi Kinoshita; Noboru Ito, both of Toyohashi; Kanji Takata, Neyagawa, all of Japan

[73] Assignee: Matsushita Electric Industrial Co., Ltd., Osaka, Japan

[21] Appl. No.: 08/554,012

[22] Filed: Nov. 6, 1995

[30] Foreign Application Priority Data

Nov. 8, 1994 [JP] Japan .................................. 6-273408

[51] Int. Cl.[7] .................................................. H01M 10/46
[52] U.S. Cl. .......................... 320/116; 320/118; 320/136
[58] Field of Search ..................... 320/116, 118, 320/132, 136, 147, 152, 153, 150, 162, 163, DIG. 18, DIG. 21, FOR 114, FOR 134, FOR 138, FOR 142, FOR 145, FOR 147

[56] References Cited

U.S. PATENT DOCUMENTS

| | | | |
|---|---|---|---|
| 5,548,200 | 8/1996 | Nor et al. | 320/139 X |
| 5,565,759 | 10/1996 | Dunstan | 320/135 |
| 5,600,230 | 2/1997 | Dunstan | 320/DIG. 21 X |

*Primary Examiner*—Edward H. Tso
*Attorney, Agent, or Firm*—Akin, Gump, Strauss, Hauer & Feld, L.L.P.

[57] ABSTRACT

Voltage monitoring units are connected in parallel to each of battery modules constituting a battery pack, and they measure the voltages; photocouplers which receive outputs of the units as the primary inputs generate secondary outputs which are electrically insulated from the primary inputs; and the secondary outputs are transmitted to an external control apparatus.

6 Claims, 6 Drawing Sheets

MONITORING APPARATUS FOR A SERIES ASSEMBLY OF BATTERY MODULES

BACKGROUND OF THE INVENTION

1. Field of the Invention

The present invention relates to an apparatus for monitoring the state of a battery, particularly of a storage battery which is in the form of what is called a battery pack formed by assembling a plurality of battery modules each consisting of a plurality of sealed-type nickel-metal hydride batteries or the like, and to be installed particularly in a movable body such as an electric vehicle.

2. Description of the Prior Art

A sealed-type nickel-metal hydride battery is excellent in fundamental properties such as an energy density, an output density and a life cycle and is under development for practical use as a power source of a movable body such as an electric vehicle. When such a battery is to be used in an electric vehicle, a battery capacity and a total voltage are required to be 50 to 120 Ah and about 100 to 350 V, respectively, in order to obtain a predetermined output. In a nickel-metal hydride battery, since an output voltage of one cell which is the minimum unit in a practical use is about 1.2 V, a number of cells are to be connected in series to one another so as to obtain a required total voltage. For example, when 10 cells are connected in series to constitute 1 module and 24 modules are connected in series, a battery pack of 240 cells is formed and a total voltage of 288 V is obtained.

In an electric vehicle using the above-mentioned battery as the power source, a state of ability of the battery must be monitored to always ensure a constant running ability.

Conventionally, a process of monitoring the state of ability of the battery pack is mainly conducted by monitoring the terminal voltage, and specifically, a voltage across the positive and negative terminals of the whole of the battery pack, i.e., the total voltage is directly measured by an instrument.

In the conventional measuring method as described above, the voltage to be measured is high (for example, 288 V), and the high voltage is directly supplied to the instrument. In an electric vehicle, a battery is usually disposed under the floor (outside the vehicle) and therefore there is little fear that a person accidentally touches a high voltage portion of the battery during a normal operation or the like. However, a monitor for displaying the voltage is disposed, for example, in the vicinity of the dashboard inside the vehicle, and therefore a high voltage wire must be led to the dashboard. This requires countermeasures for maintaining insulation to be taken at various portions, thereby producing a problem that a considerably bulky configuration is required, and furthermore causes a serious problem that there is a risk of electrical shock against the human body.

Even when one of modules or cells constituting a battery pack involves a failure (including run-down), such a failure does not largely affect the total voltage. Therefore, a failure of a battery is hardly detected. Moreover, there is a further problem that, even when an existence of a faulty battery is detected, it is difficult to identify a faulty module.

OBJECT AND SUMMARY OF THE INVENTION

The present invention has been realized in order to solve the above-mentioned problems. It is an object of the invention to offer a monitoring apparatus for battery pack which can safely monitor a voltage, etc. of the battery pack generating a high voltage while avoiding dangers such as that caused by wiring a high tension line into the interior of a vehicle.

It is another object of the invention to provide a monitoring apparatus for battery pack which can correctly monitor a state of a battery so that a faulty battery is easily detected and identified.

In order to attain the objects, the monitoring apparatus for a battery pack in the present invention has a configuration: with respect to a battery pack consisting of a series assembly of a plurality of battery modules, voltage measuring means connected across both terminals of each of the battery modules measure a voltage; signal isolating means which receives an output of the respective voltage measuring means as a primary input and generates a secondary output which is electrically insulated from the primary input; and the secondary output is transmitted to an external control apparatus through signal transmitting means.

In the thus composed monitoring apparatus for a battery pack, a voltage of each battery module is measured; the measurement output is handled as a primary input; the secondary output which is electrically insulated from the primary input is generated; and the secondary output is transmitted to the control apparatus. Consequently, the voltage of a battery pack which is high as a whole can be dividedly measured, whereby the safety is ensured and a faulty battery is easily detected and identified. The insulation configuration prevents the signal transmitting means from being raised to a high potential, moreover, wires for power supply and those for measurement can be used commonly, and therefore the number of distributing wires can be reduced.

The second output may be transmitted to the control apparatus through a serial transmission line, so that the number of transmitting wires can be reduced.

The battery to be measured may be used as an operation power source for the means, so that it is not required to separately prepare a power source.

The other monitoring apparatus for a battery pack in the present invention has a configuration: voltage monitoring units are composed of a master unit and a slave unit(s); the master unit directly receives a voltage measurement instruction signal from an external control apparatus to execute a voltage measurement and outputs a voltage measurement instruction signal to the slave unit. Since the slave unit executes a voltage measurement in response to the voltage measurement instruction signal from the master unit, a plurality of voltage monitoring units can simultaneously execute the voltage measurement. Therefore, a reliability of measured data is high.

Each voltage monitoring unit may include a CPU and may be designed so as to alternately repeat a voltage measuring mode for measuring a voltage and a sleep mode for saving a consumed current, thereby presenting the apparatus which consumes a small power.

The further monitoring apparatus for a battery pack in the present invention has temperature measuring means and pressure measuring means which are additionally provided, and measured data are serially issued; therefore, the apparatus can have a configuration into which various functions are incorporated and which is compact in size.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

It will be recognized that some or all of the Figures are schematic representations for purposes of illustration and do not necessarily depict the actual relative sizes or locations of the elements shown.

DESCRIPTION OF THE PREFERRED EMBODIMENTS

Hereinafter, preferred embodiments of the present invention will be described with reference to the accompanying drawings.

Figure 1:
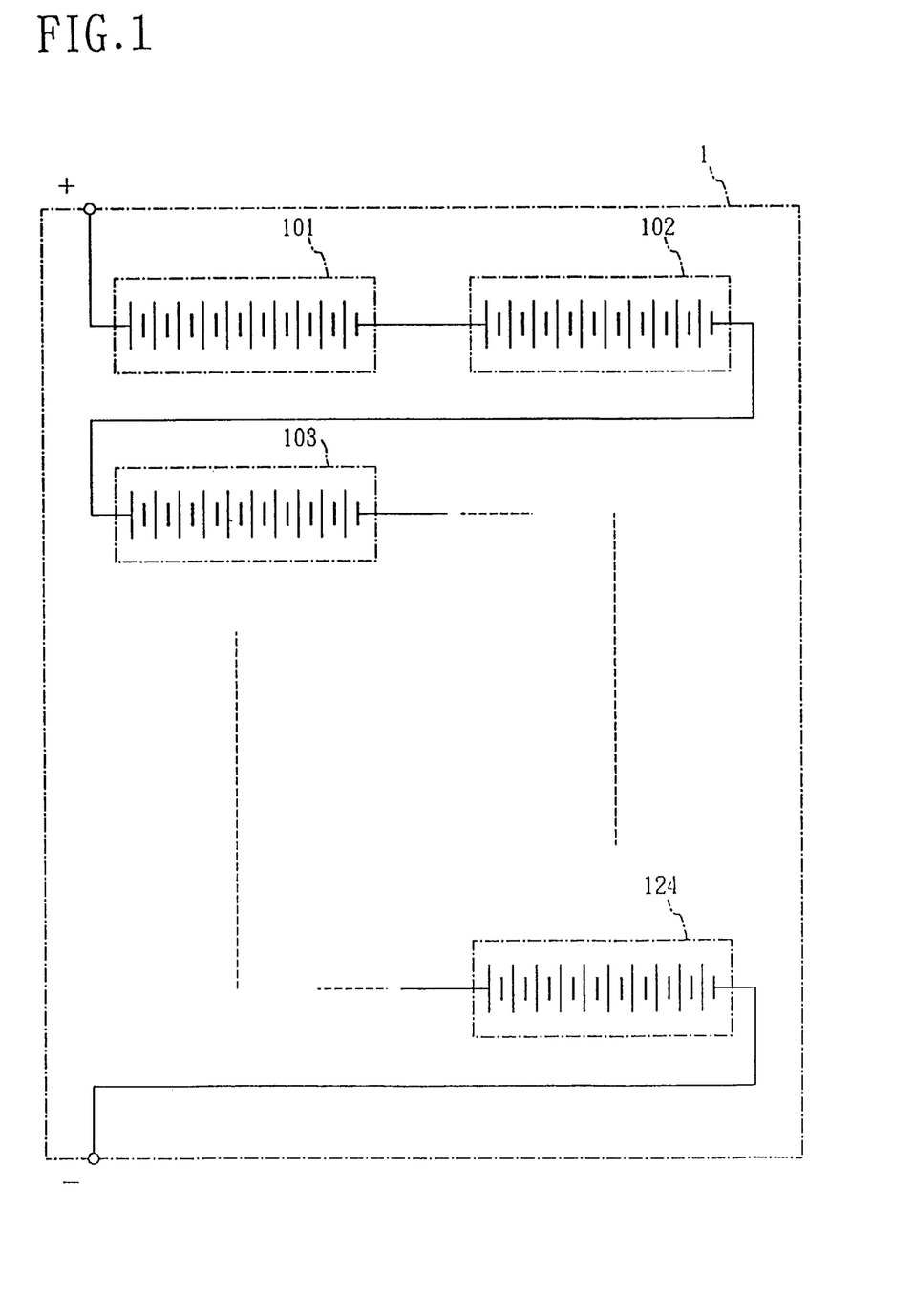
FIG. 1 is a diagram showing an internal circuit configuration of a battery pack.

FIG. 1 is an internal circuit diagram of a storage battery which is to be installed in a movable body such as an electric vehicle and consists of an assembly of sealed-type nickel-metal hydride batteries. The battery 1 is a battery pack (hereinafter, referred to as a battery pack 1) in which a plurality (in the embodiment, for example, 24) of modules 101, 102, 103, ..., and 124 are connected in series, and each of the modules further consists of a series assembly of a plurality (usually, 10) of cells.

Figure 2:
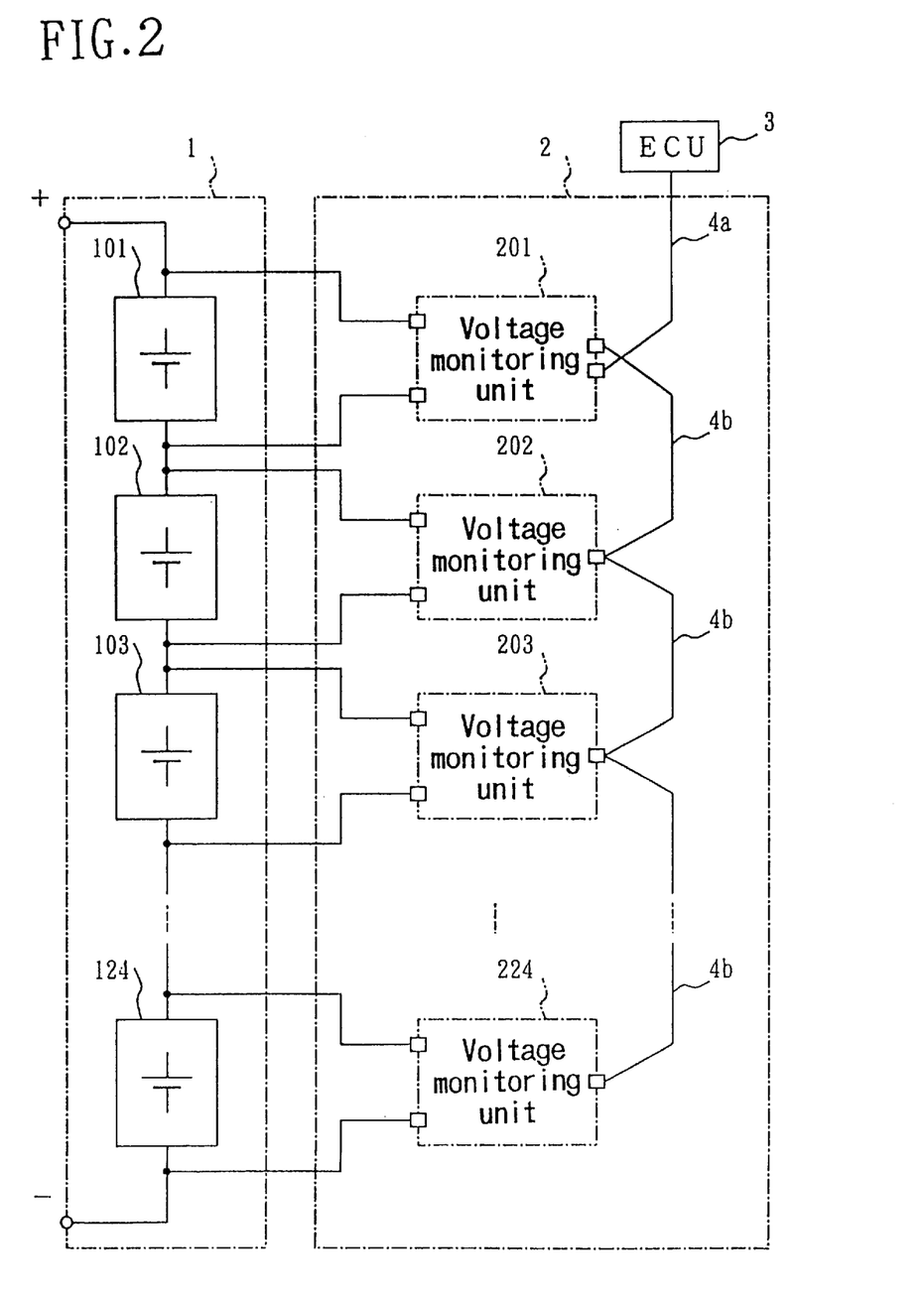
FIG. 2 is a block circuit diagram showing a monitoring apparatus for battery pack in the present invention.

FIG. 2 is a circuit diagram showing a monitoring apparatus 2 for battery pack according to the embodiment. All apparatuses shown in the figure are installed in a movable body such as an electric vehicle. Referring to FIG. 2, in the battery pack 1, voltage monitoring units 201, 202, 203, ..., and 224 are connected across the modules 101, 102, 103, ..., and 124, respectively. The voltage monitoring units 201 to 224 respectively receive terminal voltages of the modules 101 to 124 as a signal to be measured, and are powered by the terminal voltages of the respective modules. The voltage monitoring unit 201 is connected to an electronic controlling unit (hereinafter, abbreviated as an ECU) 3 through a serial communication line 4a. The voltage monitoring unit 201 is also connected to the other voltage monitoring units 202 to 224 through serial communication lines 4b. In the embodiment, the voltage monitoring unit 201 functions as a master unit, and the other voltage monitoring units 202 to 224 function as slave units. Hereinafter, as needed, the voltage monitoring unit 201 may be called the master unit 201, and the voltage monitoring units 202 to 224 may be called the slave units 202 to 224, respectively.

Figure 3:
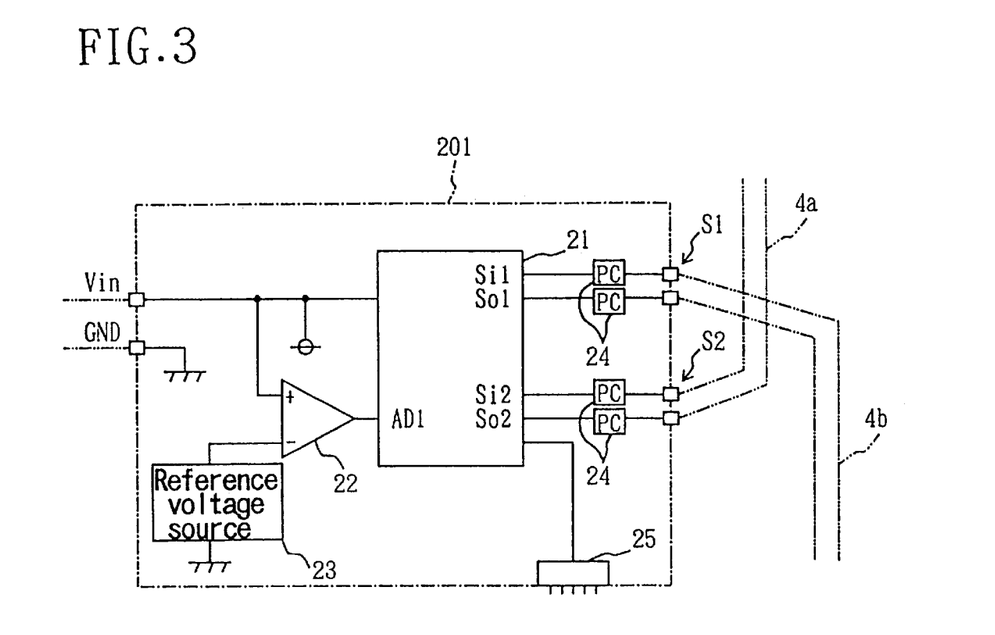
FIG. 3 is an internal circuit diagram of a voltage monitoring unit (master unit) of FIG. 2.
Figure 4:
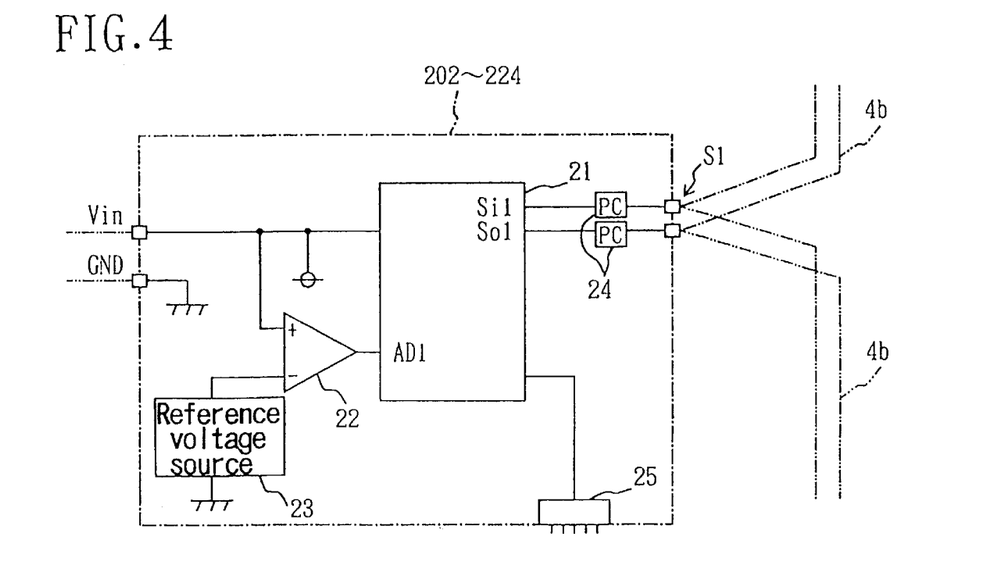
FIG. 4 is an internal circuit diagram of a voltage monitoring unit (slave unit) of FIG. 2.

FIG. 3 is an internal circuit diagram of the master unit 201, and FIG. 4 is an internal circuit diagram of the slave units 202 to 224.

In FIG. 3, the master unit 201 includes a one-chip CPU 21. The positive voltage input from the module 101 of FIG. 2 is connected to an input terminal Vin, and the negative voltage input to a GND terminal. The positive voltage input is supplied to a power source terminal of the CPU 21, and supplied also as a power source for other devices in the voltage monitoring unit 201. The input terminal Vin is connected to an input terminal of an operational amplifier 22. An output voltage of a reference voltage source 23 is supplied to the other input terminal of the operational amplifier 22. Input and output ports Si1 and So1 of the CPU 21 are connected to a serial communication terminal S1 through photocouplers 24, respectively. Input and output ports Si2 and So2 are connected to a serial communication terminal S2 through other photocouplers 24, respectively. The CPU 21 is connected to a 5-bit dip switch 25 so that an address can be set. An address number is previously set for each of the voltage monitoring units 201 to 224. Functionally, the CPU 21, the operational amplifier 22, and the reference voltage source 23 constitute voltage measuring means, the photocouplers 24 constitute signal isolating means, and the CPU 21 and the serial communication lines 4a and 4b constitute signal transmitting means.

An internal circuit of each of the slave units 202 to 224 shown in FIG. 4 is the same as that of FIG. 3 except that the serial communication terminal S2 and the photocouplers 24 connected thereto are omitted.

In FIG. 3 and FIG. 4, DC voltages which are respectively input to the voltage monitoring units 201 to 224 are as low as about 12 V, and therefore no high tension line is disposed in each unit. In the circuits shown in FIG. 3 and FIG. 4, since the photocouplers 24 are disposed in digital input/output lines, the primary side is electrically insulated from the secondary side. Therefore, although the voltage monitoring units 201 to 224 are connected to each other through the serial communication lines 4a and 4b, a short-circuit state between the units does not occur. In the voltage monitoring units 201 to 224, the circuit portions (the portions in the left side in the figures) before the photocouplers 24 are electrically independent from each other.

As described above, the apparatus is constituted so that measurement of voltage is not made on a total voltage, but made on regularly-divided portions, and therefore, drop of performance or abnormal state of the battery pack 1 can be detected in the unit of a module. Thereby, a faulty module can be identified easily and rapidly. When a faulty module is once identified, it is relatively easy to identify a faulty cell in the module.

Furthermore, for example, in case one module which is inferior in ability to other modules may be intentionally inserted to prevent the battery from being over-discharged, detection of a voltage drop in this module indicates that the battery comes to a state for recharging.

Figure 5:
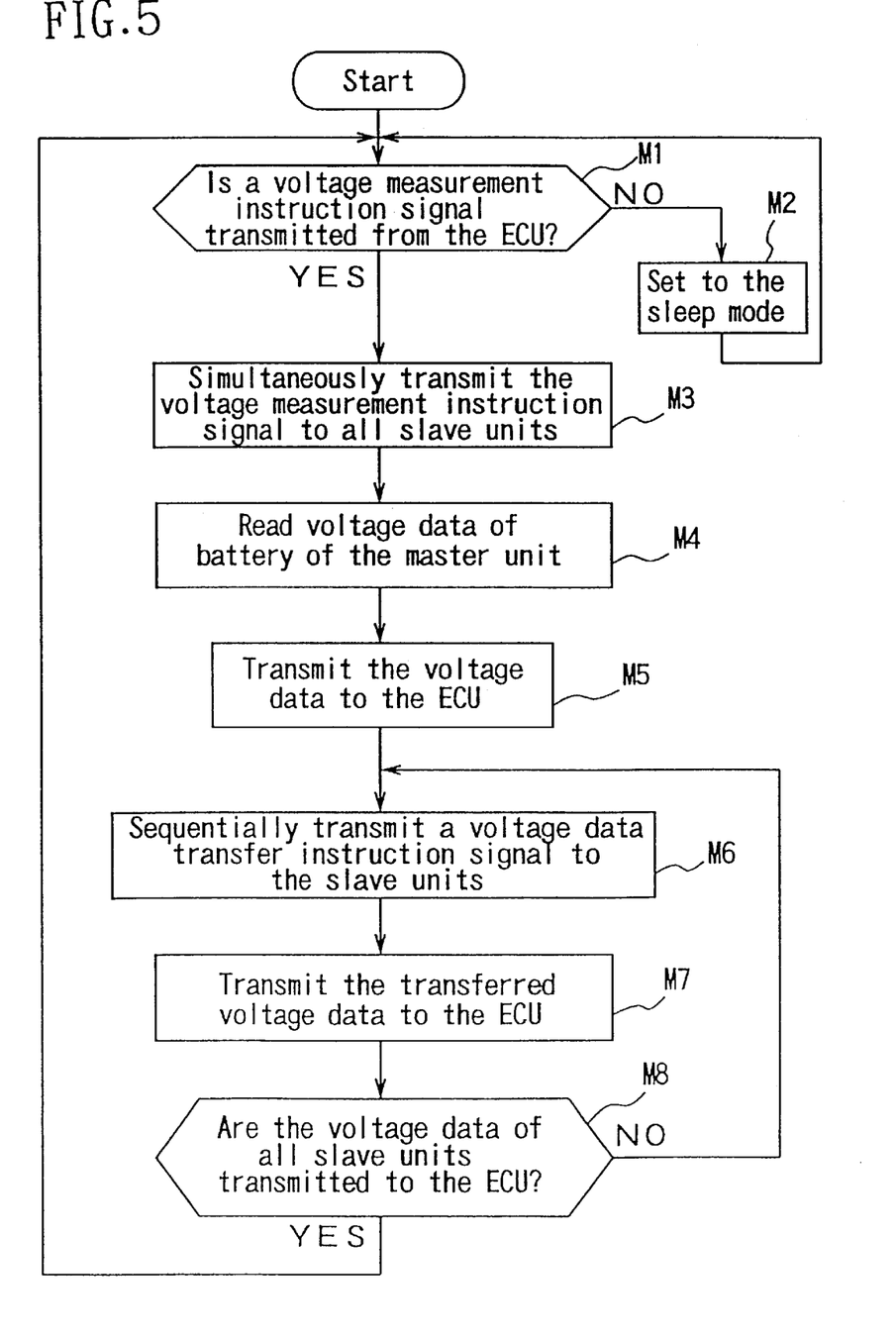
FIG. 5 is a flow chart which is to be executed by a CPU in the voltage monitoring unit (master unit) shown in FIG. 3.
Figure 6:
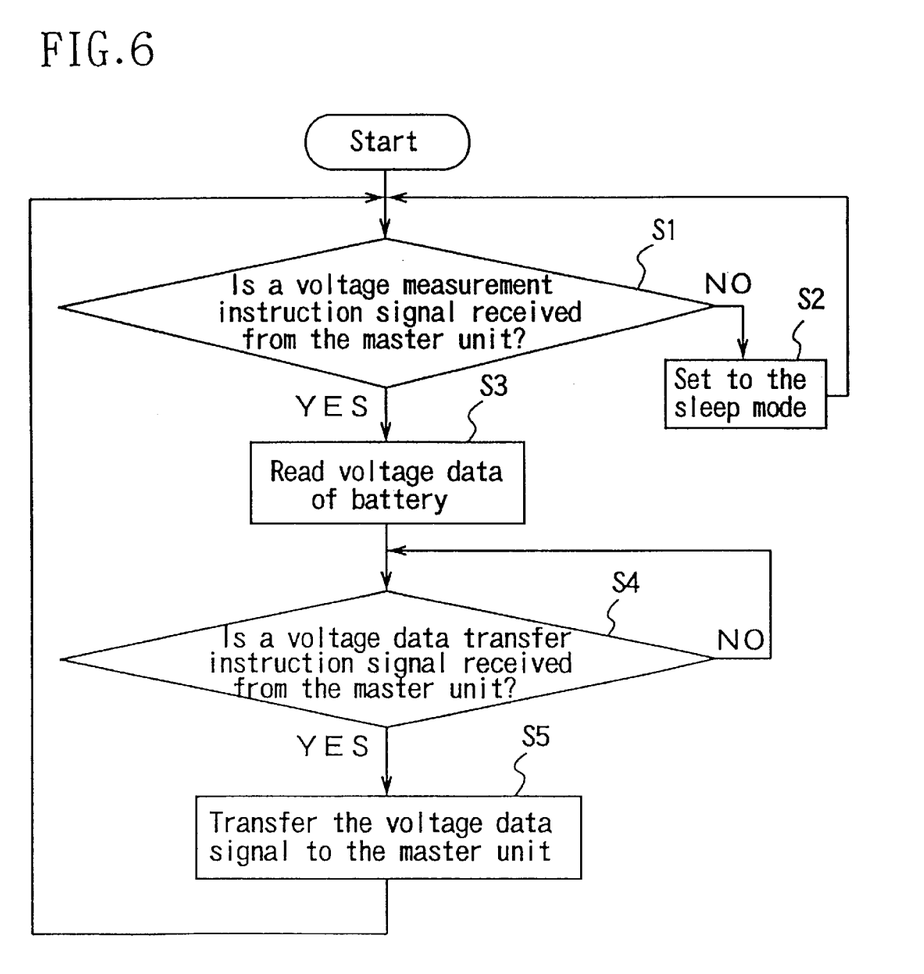
FIG. 6 is a flow chart which is to be executed by a CPU in the voltage monitoring unit (slave unit) shown in FIG. 4.

FIG. 5 and FIG. 6 are flow charts which are to be respectively executed by the CPUs 21 in the master unit 201 and the slave units 202 to 224. Hereinafter, operation of the configuration shown in FIG. 2 to FIG. 4 will be described with reference to FIG. 5 and FIG. 6.

Referring to FIG. 2 to FIG. 4, the CPU 21 of the master unit 201 judges in step M1 (FIG. 5) whether the voltage measurement instruction signal is transmitted from the ECU 3 through the serial communication line 4a or not. During the period when the voltage measurement instruction signal is not received, the CPU 21 is set to a sleep mode (step M2), power supply to the devices other than the CPU 21 is turned off so that a power consumption is reduced to a level as low as possible, and the CPU waits the signal. When the voltage measurement instruction signal from the ECU 3 is input to the CPU 21, the CPU 21 outputs the voltage measurement instruction signal to the serial communication terminal S1 (step M3) so that the slave units 202 to 224 can simultaneously carry out the voltage measurement. The signal is transmitted to all the slave units 202 to 224 through the serial communication line 4b.

The CPU 21 of each of the slave units 202 to 224 judges in step S1 of FIG. 6 whether the voltage measurement instruction signal is transmitted from the master unit 201 or not. During the period when the voltage measurement instruction signal is not received, the CPU 21 is set to a sleep mode (step S2), power supply to the devices other than the CPU 21 is turned off so that a power consumption is reduced to a level as low as possible, and the CPU waits the signal. As described above, the voltage measurement instruction signal from the master unit 201 is now input to the CPU 21. Upon receipt of this signal, the CPU 21 converts an analog value input to an A/D conversion input port AD1 to a digital value, and reads the converted value as voltage data of the battery (step S3). The analog value input to the A/D conversion input port AD1 is a value which is proportional to a difference between a predetermined reference voltage and each of terminal voltages of the respective batteries 101 to 124.

All the slave units 202 to 224 simultaneously execute the above-described operation of reading voltage data. At substantially the same time, the master unit 201 also executes the operation of reading voltage data in step M4 (FIG. 5). In this way, the CPU 21 of each of the voltage monitoring units 201 to 224 stores the voltage data of the respective batteries to be measured.

Next the CPU 21 of the voltage monitoring unit 201 transmits the voltage data stored therein to the ECU 3 (step M5 of FIG. 5). Then the CPU 21 issues instructions (the voltage measurement instruction signal), for sending out and transferring the stored voltage data, to the slave units 202 to 224 (step M6 of FIG. 5). On the other hand, the CPUs 21 of the slave units 202 to 224 judge in step S4 of FIG. 6 whether the signal is received or not. If the signal is not received, the CPUs repeat step S4 until the signal is received. When the voltage measurement instruction signal is received, this CPU transfers the voltage data to the master unit 201.

In response to the signal transfer, the master unit 201 transmits the voltage data to the ECU 3 through the serial communication line 4*a* (step M7 of FIG. 5). The operations of transferring and transmitting the voltage data of the slave units to the ECU are sequentially executed for all the slave units 202 to 224 (step M8).

The address numbers of the voltage monitoring units 201, 201 (sic), . . . , and 214 are added to the voltage data transmitted to the ECU 3, respectively, so that the ECU 3 can identify the voltage data. In this way, all the voltage data of the 24 modules 101 to 124 (FIG. 1 and FIG. 2) which are simultaneously measured are transmitted to the ECU 3. Thereafter, when the next voltage measurement instruction signal is transmitted from the ECU 3 (step M1 of FIG. 5), the same operations are repeated.

In an electric vehicle, since a current always changes in level in accordance with acceleration, deceleration, and the road conditions, the voltage of the battery vigorously varies; therefore, unless simultaneousness of measurements is ensured, measured data have low reliability. In this view point, the embodiment can realize simultaneousness of measurements, and it is therefore possible to obtain data of high reliability.

Figure 7:
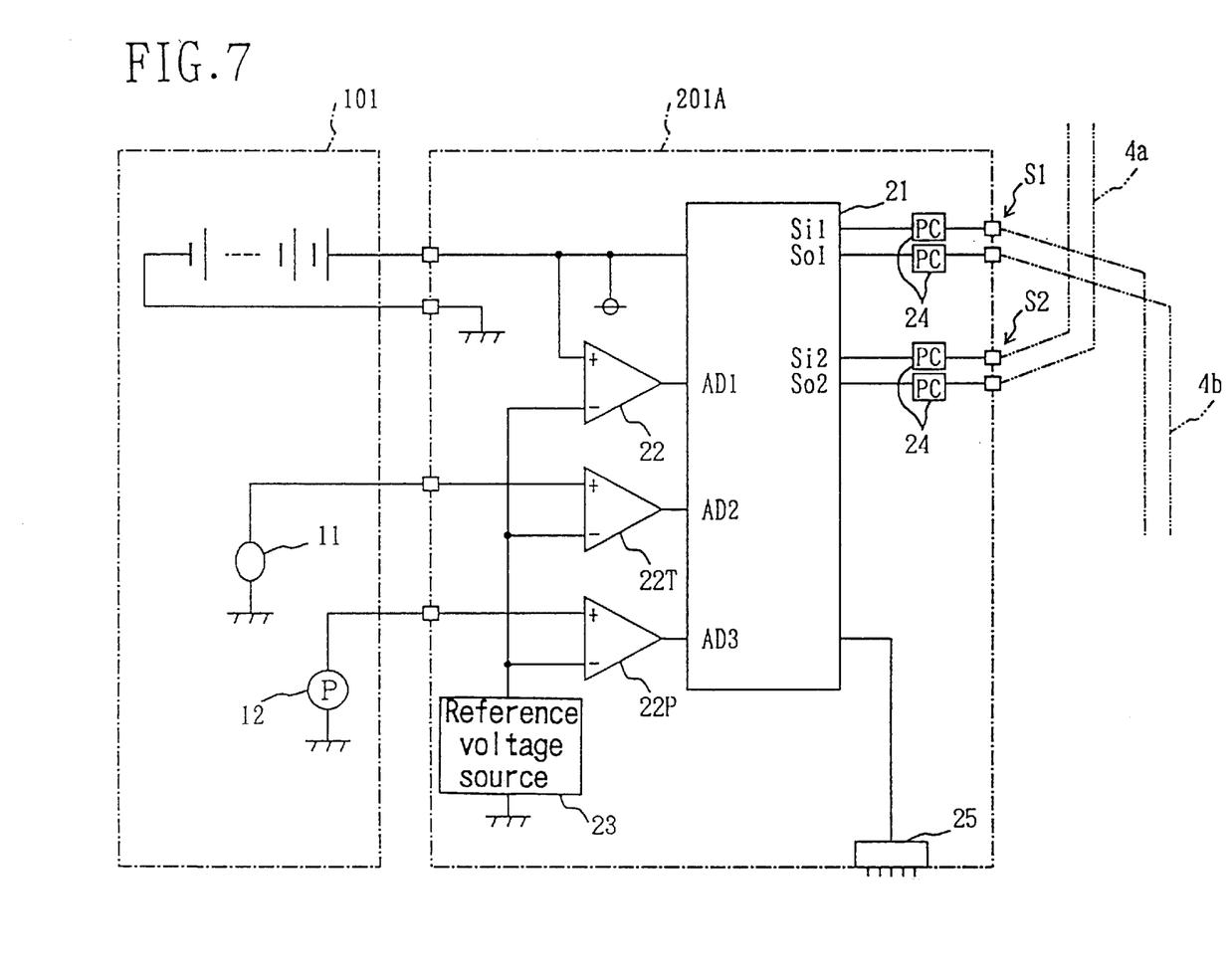
FIG. 7 is a circuit diagram showing another embodiment of the voltage monitoring unit with sensors.

FIG. 7 is a circuit diagram showing a second embodiment with respect to the voltage monitoring unit. An illustrated voltage monitoring unit 201A functions as a master unit and corresponds to the voltage monitoring unit 201 of FIG. 2 and FIG. 3.

Referring to FIG. 7, a temperature sensor 11 such as a thermistor, and a pressure sensor 12 of a semiconductor pressure sensor or a diaphragm pressure sensor are provided in a module 101 so as to output voltages respectively corresponding to the temperature and the pressure. Voltage output signals from the sensors are sent to the voltage monitoring unit 201A. The voltage monitoring unit 201A has a configuration in which operational amplifiers 22T and 22P respectively for the temperature signal and the pressure signal are added to the configuration of the voltage monitoring unit 201 shown in FIG. 3. A voltage output signal indicative of a temperature is converted by the operational amplifier 22T into an output signal which is proportional to a difference between the voltage output signal and the reference voltage generated in the reference voltage source 23, and the output signal is input to the A/D conversion input port AD2 of the CPU 21. Similarly, a voltage output signal indicative of an internal pressure of the module 101 is converted by the operational amplifier 22P into an output signal which is proportional to a difference between the voltage output signal and the reference voltage generated in the reference voltage source 23, and the output signal is input to the A/D conversion input port AD3 of the CPU 21. The signals input to the CPU 21 are converted into digital temperature data and pressure data, and they are serially issued. These data are thereafter serially transmitted to the ECU 3 (FIG. 2) in the same manner as the voltage data.

In this way, the voltage monitoring unit 201A receives the temperature and pressure data in addition to the voltage data, and these data are transmitted through the same transmission line, thereby realizing the multiple monitoring functions and the rationalization of the circuit.

It is a matter of course that the same configuration as that of the master unit 201A can be applied to the slave units.

In the above-mentioned embodiments, although the monitoring apparatus has been applied to the sealed-type nickel-metal hydride batteries, the monitoring apparatus of the invention is not restricted to this, and may be similarly applied to any battery pack as far as it consists of a plurality of modules connected in series.

In the above-mentioned embodiments, the voltage monitoring is conducted in the unit of each of the modules 101 to 124. The voltage monitoring may be conducted more finely in a similar manner or in the unit of each cell in the modules 101 to 124. For example, the voltage monitoring in the unit of a cell may be realized in the following manner: Circuits prepared in the same manner as the circuit configuration which extends from the terminal Vin shown in FIG. 3 or 4 to the terminal AD1 through the operational amplifier 22 may be disposed in the number equal to the number of the cells (ten), and voltage data of the cells may be input to the A/D conversion input terminals AD1 to AD10 (not shown).

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A monitoring apparatus for a battery pack, said battery pack including a series assembly of a plurality of battery modules, said apparatus comprising:

a plurality of voltage measuring means, each voltage measuring means being connected across both terminals of a respective one of the battery modules;

signal isolating means for receiving an output of said voltage measuring means as a primary input, and for generating a secondary output which is electrically insulated from said primary input; and signal transmitting means for transmitting said secondary output to an external control apparatus.

2. A monitoring apparatus for a battery pack according to claim 1, wherein said signal transmitting means comprises a serial transmission line.

3. A monitoring apparatus for a battery pack according to claim 1, wherein said voltage measuring means, said signal isolating means, and said signal transmitting means use said battery pack as a power source.

4. A monitoring apparatus for a battery pack, said battery pack including a series assembly of a plurality of battery modules, and a plurality of voltage monitoring units each containing voltage measuring means, each voltage measuring means being connected across both terminals of each of a respective one of the battery modules, said voltage monitoring units comprising:

a sole master unit which directly receives a voltage measurement instruction signal from an external control apparatus to execute a voltage measurement and issues a voltage measurement instruction signal to another voltage monitoring unit; and at least one slave unit which receives the voltage measurement instruction signal from said master unit to execute a voltage measurement.

5. A monitoring apparatus for a battery pack according to claim 4, wherein each of said voltage monitoring units comprises a CPU, and alternately repeats a voltage measuring mode for measuring a voltage and a sleep mode for saving a consumed current.

6. A monitoring apparatus for a battery pack, said battery pack including a series assembly of a plurality of battery modules, said apparatus comprising:

a plurality of voltage measuring means, each voltage measuring means being connected across both terminals of a respective one of the battery modules;

temperature measuring means for measuring a temperature of inside said battery modules based on an output of a temperature sensor provided in said battery modules;

pressure measuring means for measuring a pressure of inside said battery modules based on an output of a pressure sensor provided in said battery modules;

data outputting means for serially outputting voltage data measured by said voltage measuring means, temperature data measured by said temperature measuring means, and pressure data measured by said pressure measuring means;

signal isolating means for receiving an output of said data outputting means as a primary input, and for generating a secondary output which is electrically insulated from said primary input; and signal transmitting means for transmitting said secondary output to an external control apparatus.

* * * * *